(12) United States Patent
Aihara et al.

(10) Patent No.: US 11,996,302 B2
(45) Date of Patent: May 28, 2024

(54) SUBSTRATE PROCESSING APPARATUS AND SUBSTRATE PROCESSING METHOD

(71) Applicant: SCREEN Holdings Co., Ltd., Kyoto (JP)

(72) Inventors: Tomoaki Aihara, Kyoto (JP); Takahiro Yamaguchi, Kyoto (JP); Jun Sawashima, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 198 days.

(21) Appl. No.: 17/698,466

(22) Filed: Mar. 18, 2022

(65) Prior Publication Data

US 2022/0301894 A1    Sep. 22, 2022

(30) Foreign Application Priority Data

Mar. 19, 2021 (JP) .................................. 2021-046009
Feb. 18, 2022 (JP) .................................. 2022-024167

(51) Int. Cl.
*G05D 7/06* (2006.01)
*H01L 21/67* (2006.01)

(52) U.S. Cl.
CPC ..... *H01L 21/67023* (2013.01); *G05D 7/0652* (2013.01)

(58) Field of Classification Search
CPC .......... H01L 21/67023; H01L 21/6708; H01L 21/67253; H01L 21/67017;
(Continued)

(56) References Cited

U.S. PATENT DOCUMENTS 9,278,768 B2    3/2016 Kasahara et al.
10,037,901 B2    7/2018 Koyama et al.
(Continued)

FOREIGN PATENT DOCUMENTS

JP    2007-266211 A    10/2007
JP    2013-175552 A    9/2013
(Continued)

OTHER PUBLICATIONS

Office Action dated Oct. 20, 2023, issued for corresponding Korean Patent Application No. 10-2022-0032670.
(Continued)

*Primary Examiner* — Bob Zadeh
(74) *Attorney, Agent, or Firm* — OSTROLENK FABER LLP

(57) ABSTRACT

A substrate processing apparatus 100 includes a processing unit, a reservoir 31, a processing liquid pipe 32, a pump 34, a filter 35, a first flow rate section 36, a first return pipe 51, a first adjustment valve 52, a second return pipe 41, a branch supply pipe 16, a second flow rate section 42, and a controller. The first flow rate section 36 is placed in the processing liquid pipe 32 and measures a flow rate or pressure of the processing liquid flowing through the processing liquid pipe 32. The first adjustment valve 52 is placed in the first return pipe 51 and adjusts a flow rate of the processing liquid flowing through the first return pipe 51. The controller controls an opening degree of the first adjustment valve 52 based on the flow rate or the pressure of the processing liquid measured by the first flow rate section 36.

9 Claims, 10 Drawing Sheets

(58) Field of Classification Search
CPC ......... H01L 21/67051; H01L 21/67098; H01L 21/67248; G05D 7/0652; B01D 35/00; B01D 35/02; B05C 11/1026
See application file for complete search history.

(56) References Cited

U.S. PATENT DOCUMENTS

| | | | |
|---|---|---|---|
| 11,322,415 | B2 | 5/2022 | Naohara et al. |
| 11,482,427 | B2 | 10/2022 | Kiyohara et al. |
| 2003/0045104 | A1* | 3/2003 | Fujishima ......... H01L 21/67248 438/689 |
| 2013/0220478 | A1* | 8/2013 | Kasahara .................. B65B 3/04 141/2 |
| 2015/0053285 | A1* | 2/2015 | Nakashima .......... G05D 7/0664 137/565.11 |
| 2015/0328668 | A1 | 11/2015 | Koyama et al. |
| 2017/0229324 | A1* | 8/2017 | Nakashima ............... B08B 3/04 |
| 2020/0098594 | A1 | 3/2020 | Kiyohara et al. |
| 2020/0111715 | A1 | 4/2020 | Naohara et al. |
| 2022/0216117 | A1 | 7/2022 | Naohara et al. |
| 2022/0301894 | A1* | 9/2022 | Aihara .............. H01L 21/67253 |

FOREIGN PATENT DOCUMENTS

| | | | | |
|---|---|---|---|---|
| JP | 2018137367 A | * | 8/2018 | ............... B08B 3/02 |
| JP | 2018-157042 A | | 10/2018 | |
| JP | 2018157042 A | * | 10/2018 | ....... H01L 21/02052 |
| JP | 2018157149 A | * | 10/2018 | ....... H01L 21/02052 |
| KR | 10-2015-0131968 A | | 11/2015 | |
| KR | 10-2020-0033754 A | | 3/2020 | |
| KR | 20200033754 A | * | 3/2020 | |
| TW | 202006875 A | | 2/2020 | |
| TW | 202015122 A | | 4/2020 | |
| TW | 202029316 A | | 8/2020 | |
| TW | 202033285 A | | 9/2020 | |

OTHER PUBLICATIONS

Notice of Allowance dated Dec. 12, 2022 for the corresponding Taiwanese Patent Application No. 111108154.
Notice of Allowance dated Mar. 21, 2024 issued for the corresponding Korean Patent Application No. 10-2022-0032670.

* cited by examiner

SUBSTRATE PROCESSING APPARATUS AND SUBSTRATE PROCESSING METHOD

INCORPORATION BY REFERENCE

The present application claims priority under 35 U.S.C. § 119 to Japanese Patent Application No. 2021-046009, filed on Mar. 19, 2021 and Japanese Patent Application No. 2022-024167, filed on Feb. 18, 2022. The contents of these applications are incorporated herein by reference in their entirety.

BACKGROUND

The present disclosure relates to a substrate processing apparatus and a substrate processing method.

The manufacturing process of a semiconductor device, a liquid crystal display device or the like needs using a substrate processing device for processing a semiconductor wafer or a substrate such as a glass substrate for the liquid crystal display device. A single-wafer type substrate processing apparatus that processes substrates one by one is disclosed. Such a substrate processing apparatus includes a processing unit, a processing liquid tank that stores a processing liquid to be supplied to the processing unit, a circulation pipe that circulates the processing liquid in the processing liquid tank, a pump that sends the processing liquid in the processing liquid tank to the circulation pipe, and a filter that filters the processing liquid flowing through the circulation pipe (for example, Patent Literature 1 (JP 2013-175552 A) and Patent Literature 2 (JP 2007-266211 A)).

SUMMARY

A substrate processing apparatus according to an aspect of the present disclosure includes a processing unit, a reservoir, a processing liquid pipe, a pump, a filter, a first flow rate section, a first return pipe, a first adjustment valve, a second return pipe, a branch supply pipe, a second flow meter, and a controller. The processing unit processes a substrate with a processing liquid. The reservoir stores the processing liquid. The processing liquid pipe is connected to the reservoir and allows the processing liquid to flow through. The pump is placed in the processing liquid pipe and supplies the processing liquid from the reservoir to the processing liquid pipe. The filter is placed in the processing liquid pipe and captures particles in the processing liquid. The first flow rate section is placed in the processing liquid pipe and measures a flow rate or pressure of the processing liquid flowing through the processing liquid pipe. The first return pipe is connected to a downstream end of the processing liquid pipe and returns the processing liquid to the reservoir. The first adjustment valve is placed in the first return pipe and adjusts a flow rate of the processing liquid flowing through the first return pipe. The second return pipe is connected to the downstream end of the processing liquid pipe and returns the processing liquid to the reservoir. The branch supply pipe branches from the second return pipe and supplies the processing liquid to the processing unit. The second flow meter measures a flow rate or pressure of the processing liquid flowing through the second return pipe. The controller controls an opening degree of the first adjustment valve based on the flow rate or the pressure of the processing liquid measured by the first flow rate section.

A substrate processing apparatus according to the present disclosure includes a processing unit, a reservoir, a processing liquid pipe, a pump, a filter, a first flow meter, a first return pipe, a first adjustment valve, a second return pipe, a branch supply pipe, a second flow meter, and a controller. The processing unit processes a substrate with a processing liquid. The reservoir stores the processing liquid. The processing liquid pipe is connected to the reservoir and allows the processing liquid to flow through. The pump is placed in the processing liquid pipe and supplies the processing liquid from the reservoir to the processing liquid pipe. The filter is placed in the processing liquid pipe and captures particles in the processing liquid. The first flow meter is placed in the processing liquid pipe and measures a flow rate of the processing liquid flowing through the processing liquid pipe. The first return pipe is connected to a downstream end of the processing liquid pipe and returns the processing liquid to the reservoir. The first adjustment valve is placed in the first return pipe and adjusts a flow rate of the processing liquid flowing through the first return pipe. The second return pipe is connected to the downstream end of the processing liquid pipe and returns the processing liquid to the reservoir. The branch supply pipe branches from the second return pipe and supplies the processing liquid to the processing unit. The second flow meter is placed in the second return pipe at a position on an upstream side of the branch supply pipe and measures a flow rate of the processing liquid flowing through the branch supply pipe. The controller controls an opening degree of the first adjustment valve based on the flow rate of the processing liquid measured by the first flow meter.

In an embodiment, the second flow meter is placed in the second return pipe at a position on a downstream side of the branch supply pipe and measures pressure of the processing liquid flowing through the second return pipe.

In an embodiment, the controller controls the opening degree of the first adjustment valve so that the flow rate of the processing liquid flowing through the processing liquid pipe becomes a predetermined flow rate.

In an embodiment, the substrate processing apparatus further includes a temperature controller that is placed in the processing liquid pipe. The temperature controller adjusts a temperature of the processing liquid flowing through the processing liquid pipe.

In an embodiment, the substrate processing apparatus further comprises a second adjustment valve that is placed in the second return pipe and that adjusts a flow rate of the processing liquid flowing through the second return pipe. The controller controls the opening degree of the first adjustment valve and an opening degree of the second adjustment valve.

In an embodiment, the substrate processing apparatus further includes a thermometer that is placed in the processing liquid pipe and that measures temperature of the processing liquid flowing through the processing liquid pipe. The controller controls the opening degree of the second adjustment valve based on the temperature of the processing liquid measured by the thermometer.

In an embodiment, the processing unit includes a nozzle that is placed at a downstream end of the branch supply pipe, a switch section that switches between start and stop of supply of the processing liquid from the branch supply pipe to the nozzle, and a third return pipe that branches from the branch supply pipe and that is connected to the second return pipe on a downstream side of the second adjustment valve.

A method according to the present disclosure is a substrate processing method of a substrate processing apparatus. The substrate processing apparatus includes a processing unit, a reservoir, a processing liquid pipe, a pump, a filter, a first flow rate section, a first return pipe, a first adjustment valve, a second return pipe, a branch supply pipe, and a second flow meter. The processing unit processes a substrate with a processing liquid. The reservoir stores the processing liquid. The processing liquid pipe is connected to the reservoir and allows the processing liquid to flow through. The pump is placed in the processing liquid pipe. The filter is placed in the processing liquid pipe. The first flow rate section is placed in the processing liquid pipe. The first return pipe is connected to a downstream end of the processing liquid pipe and returns the processing liquid to the reservoir. The first adjustment valve is placed in the first return pipe and adjusts a flow rate of the processing liquid flowing through the first return pipe. The second return pipe is connected to the downstream end of the processing liquid pipe and returns the processing liquid to the reservoir. The branch supply pipe branches from the second return pipe and supplies the processing liquid to the processing unit. The second flow meter is placed in the second return pipe. The substrate processing method includes supplying the processing liquid from the reservoir to the processing liquid pipe, capturing particles in the processing liquid, measuring a flow rate or pressure of the processing liquid flowing through the processing liquid pipe, measuring a flow rate or pressure of the processing liquid flowing through the second return pipe, and controlling an opening degree of the first adjustment valve based on the flow rate or the pressure of the processing liquid measured by the first flow rate section.

DETAILED DESCRIPTION

Figure 1:
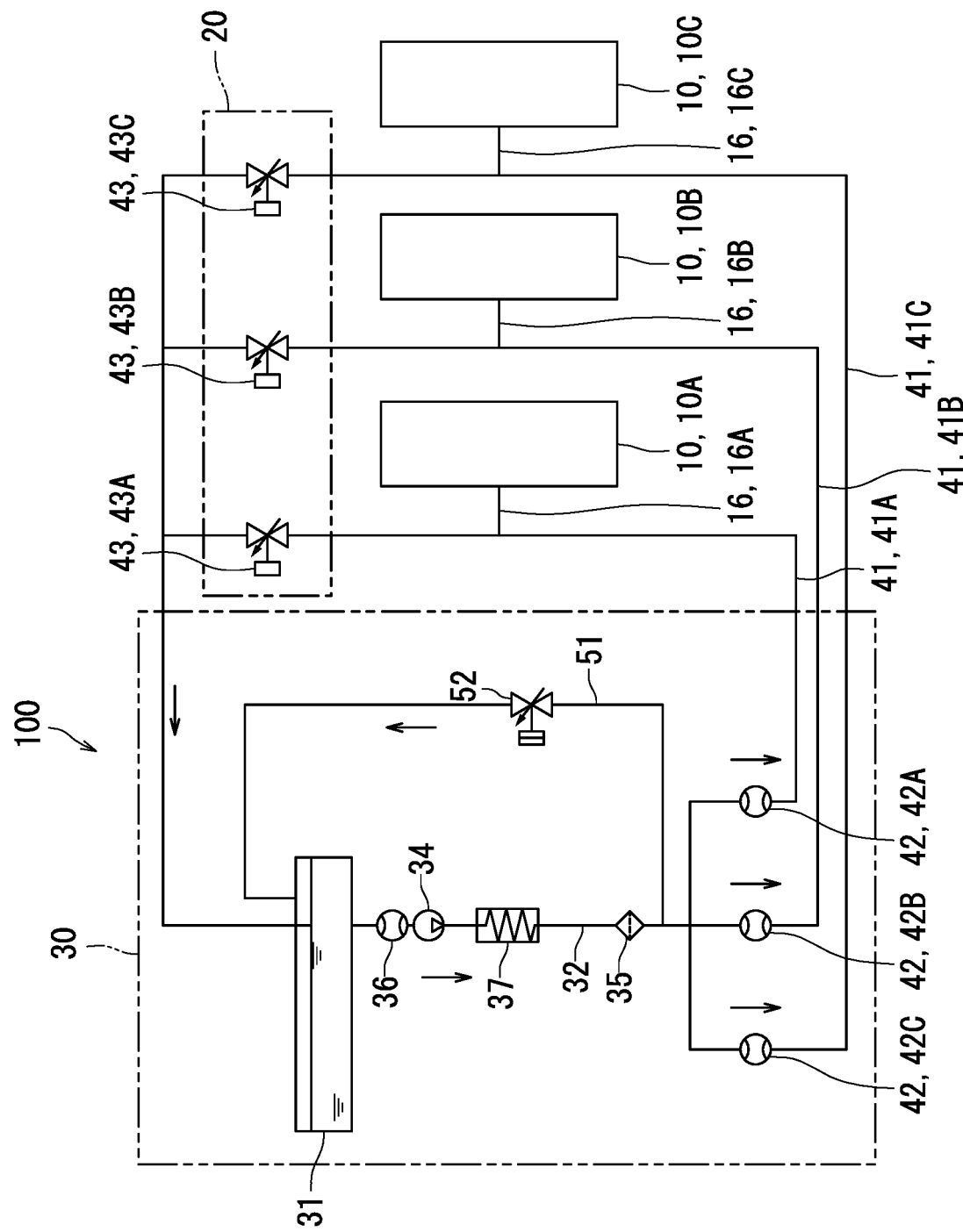
FIG. 1 is a schematic view of a substrate processing apparatus according to a first embodiment of the present disclosure.

Hereinafter, embodiments of the present disclosure will be described with reference to the drawings (FIGS. 1 to 10). However, the present disclosure is not limited to the following embodiments. It is noted that the duplicated description may be omitted as appropriate. Further, in the drawings, the same or corresponding elements are assigned the same reference signs and descriptions thereof are not repeated.

Various substrates applicable to a "substrate" to be processed by the substrate processing apparatus and the substrate processing method according to the present disclosure include semiconductor wafers, glass substrates for photomasks, glass substrates for liquid crystal displays, glass substrates for plasma displays, and substrates for Field Emission Displays (FEDs), substrates for optical disks, substrates for magnetic disks, and substrates for magneto-optical disks. Hereinafter, a substrate processing apparatus and a substrate processing method for processing a disk-shaped semiconductor wafer will be mainly described as an example of the present embodiment. However, the substrate processing apparatus and the substrate processing method according to the present disclosure can be similarly applied to various substrates other than the above-mentioned semiconductor wafers. Further, the shape of each substrate is not limited to the disk shape, and the substrate processing apparatus and the substrate processing method according to the present disclosure can be applied to substrates having various shapes.

Further, examples of a "processing liquid" in the present embodiment include an etching liquid, a rinsing liquid, SC1 and SC2. The etching liquid etches a substrate W. Examples of the etching liquid include hydrofluoric nitric acid (mixture of hydrofluoric acid (HF) and nitric acid ($HNO_3$)), hydrofluoric acid, buffered hydrofluoric acid (BHF), ammonium fluoride, mixture of hydrofluoric acid and ethylene glycol (HFEG), sulfuric acid ($H_2SO_4$) and phosphoric acid ($H_3PO_4$). The rinsing liquid rinses the substrate W. Specifically, the rinsing liquid is used to wash away the etching liquid remaining on the substrate W. Examples of the rinsing liquid include deionized water, carbonated water, electrolytic ionized water, hydrogen water, ozone water, hydrochloric acid water having a diluted concentration (for example, about 10 ppm to 100 ppm), and an organic solvent. The organic solvent is, for example isopropyl alcohol (IPA) or sulfuric acid. Each of SC1 and SC2 cleans the substrate W. SC1 is, for example a mixed solution containing $NH_4OH$ and $H_2O_2$. The processing liquid is not particularly limited, but the first to third embodiments in which the processing liquid is IPA will be hereinafter described.

First Embodiment

Hereinafter, a first embodiment of the present disclosure will be described with reference to FIGS. 1 to 5. First, a substrate processing apparatus 100 according to the first embodiment will be described with reference to FIGS. 1 and 2. FIG. 1 is a schematic view of the substrate processing apparatus 100 of the first embodiment. Specifically, FIG. 1 is a schematic cross-sectional view of the substrate processing apparatus 100. The substrate processing apparatus 100 processes a substrate W. More specifically, the substrate processing apparatus 100 is a single-wafer type apparatus.

As illustrated in FIG. 1, the substrate processing apparatus 100 includes a plurality of processing towers 10, a plurality of branch supply pipes 16, a plurality of external circulation pipes 41, a fluid cabinet 30, and a platform 20. Each of the external circulation pipes 41 is an example of a "second return pipe".

The fluid cabinet 30 includes a processing liquid tank 31. The processing liquid tank 31 is an example of a "reservoir". The processing liquid tank 31 stores a processing liquid.

Each of the external circulation pipes 41 returns the processing liquid supplied from the fluid cabinet 30 to the processing liquid tank 31. Each of the external circulation pipes 41 is a tubular member having a flow channel that allows the processing liquid to flow through. Specifically, the upstream end of each of the external circulation pipes 41 is connected to the fluid cabinet 30. The downstream end of each of the external circulation pipes 41 is connected to the processing liquid tank 31.

Specifically, the external circulation pipes 41 include, for example, a first external circulation pipe 41A, a second external circulation pipe 41B, and a third external circulation pipe 41C. In other words, the substrate processing apparatus 100 according to the first embodiment includes three external circulation pipes 41.

The processing towers 10 include, for example, a first processing tower 10A, a second processing tower 10B, and a third processing tower 10C. In other words, the substrate processing apparatus 100 according to the first embodiment includes three processing towers 10. The processing towers 10 each have a similar configuration.

The branch supply pipes 16 include, for example, a first branch supply pipe 16A, a second branch supply pipe 16B, and a third branch supply pipe 16C. The first branch supply pipe 16A branches from the first external circulation pipe 41A and supplies the processing liquid to the first processing tower 10A. The second branch supply pipe 16B branches from the second external circulation pipe 41B and supplies the processing liquid to the second processing tower 10B. The third branch supply pipe 16C branches from the third external circulation pipe 41C and supplies the processing liquid to the third processing tower 10C.

Figure 2:
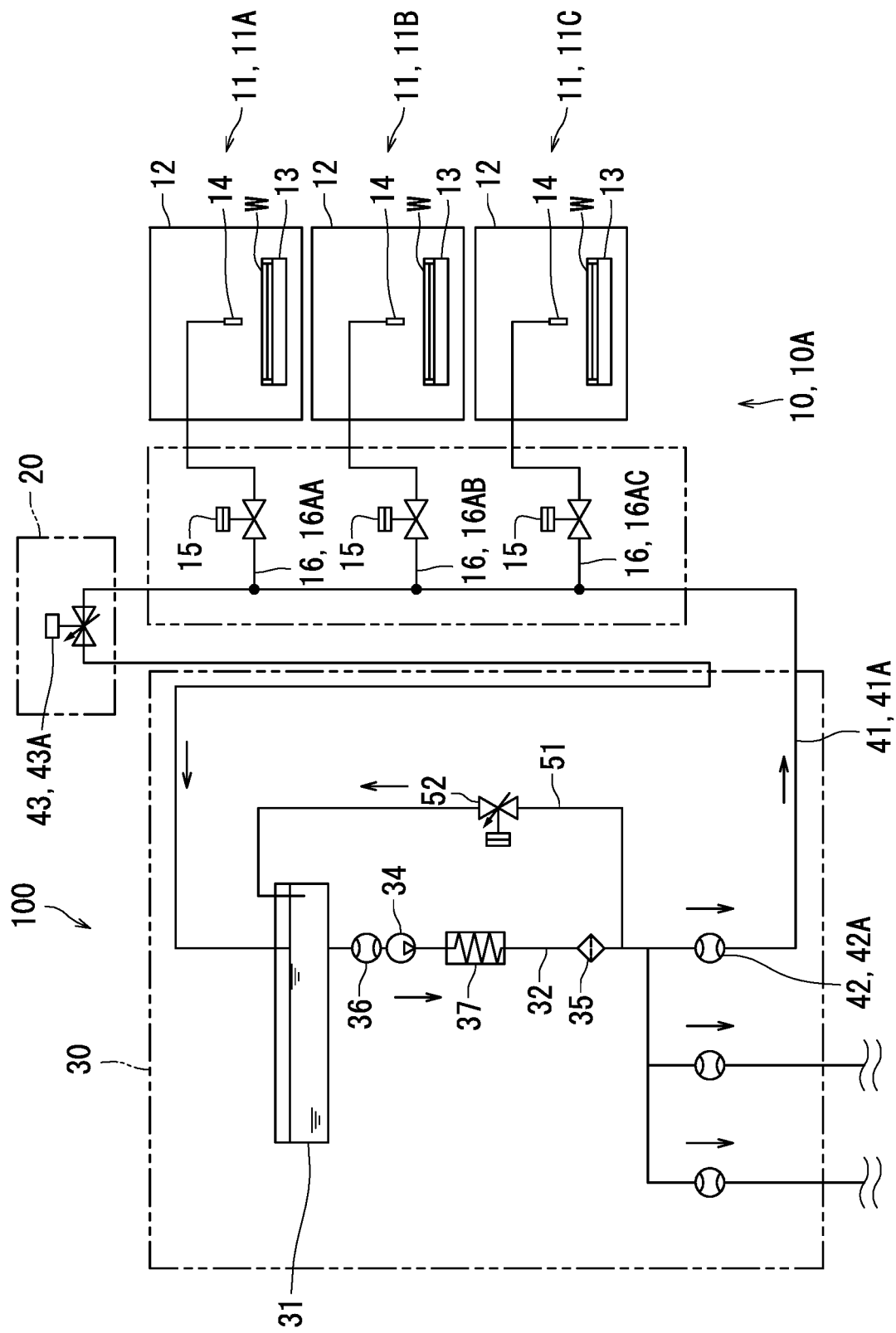
FIG. 2 is a schematic view of a processing tower included in the substrate processing apparatus according to the first embodiment.

The first processing tower 10A will subsequently be described with reference to FIG. 2. FIG. 2 is a schematic view of the processing tower 10 included in the substrate processing apparatus 100 according to the first embodiment. Specifically, FIG. 2 is a schematic cross-sectional view of the processing tower 10. As illustrated in FIG. 2, the first processing tower 10A includes a plurality of processing units 11.

Each of the processing units 11 supplies the processing liquid to the substrate W to process the substrate W. Each of the processing units 11 is a single-wafer type processing unit 11 that processes the substrate W one by one.

Specifically, the first processing tower 10A includes a plurality of processing units 11 stacked one above the other. The processing units 11 include, for example, a first processing unit 11A, a second processing unit 11B, and a third processing unit 11C. In other words, the processing units 11 according to the first embodiment includes three processing units 11.

The first branch supply pipe 16A includes, for example, a first supply pipe 16AA, a second supply pipe 16AB, and a third supply pipe 16AC. Each of the first branch supply pipes 16A is a tubular member having a flow channel that allows the processing liquid to flow through.

The first supply pipe 16AA supplies the processing liquid from the first external circulation pipe 41A to the first processing unit 11A. The second supply pipe 16AB supplies the processing liquid from the first external circulation pipe 41A to the second processing unit 11B. The third supply pipe 16AC supplies the processing liquid from the first external circulation pipe 41A to the third processing unit 11C. The processing units 11 each have a similar configuration. Hereinafter, the first processing unit 11A will be described.

The first processing unit 11A includes a chamber 12, a spin chuck 13, a nozzle 14, and an on-off valve 15. The chamber 12 is shaped like a box. The chamber 12 accommodates the substrate W, the spin chuck 13 and the nozzle 14. The spin chuck 13 allows the substrate W to rotate around a vertical rotation axis passing through the central portion of the substrate W while holding the substrate W in a horizontal posture.

The nozzle 14 is connected to the downstream end of the first supply pipe 16AA. The nozzle 14 is placed above the substrate W. This enables the nozzle 14 to discharge the processing liquid toward the substrate W from a position above the substrate W.

The on-off valve 15 opens and closes the first supply pipe 16AA. That is, the on-off valve 15 switches between start and stop of the supply of the processing liquid from the first external circulation pipe 41A to the nozzle 14. The on-off valve 15 is, for example a motor needle valve that opens and closes by electric power under control.

The fluid cabinet 30 will subsequently be described in detail. Specifically, the fluid cabinet 30 further includes a processing liquid pipe 32 and a first return pipe 51.

The processing liquid pipe 32 is connected to the processing liquid tank 31. Specifically, the upstream end of the processing liquid pipe 32 is connected to the processing liquid tank 31. The processing liquid pipe 32 is a tubular member having a flow channel that allows the processing liquid to flow through. Note that in the plane perpendicular to the flow direction of the processing liquid, the flow channel of the processing liquid pipe 32 has a cross-sectional area larger than a total cross-sectional area. The total cross-sectional area is the total area of a cross-sectional area of the flow channel of the first external circulation pipe 41A, a cross-sectional area of the flow channel of the second external circulation pipe 41B, and a cross-sectional area of the flow channel of the third external circulation pipe 41C.

The fluid cabinet 30 further includes a pump 34, a filter 35, a first flow meter 36, and a heater 37. The first flow meter 36 is an example of a "first flow rate section". The heater 37 is an example of a "temperature controller". The first flow meter 36, the pump 34, the heater 37, and the filter 35 are arranged, in this order, in the processing liquid pipe 32 from the upstream to the downstream of the processing liquid pipe 32.

The first flow meter 36 measures the flow rate of the processing liquid flowing through the processing liquid pipe 32. The "flow rate" indicates, for example the flow rate of the processing liquid passing through a unit area of the processing liquid pipe 32 per unit time.

The pump 34 supplies the processing liquid from the processing liquid tank 31 to the processing liquid pipe 32. The pump 34 is, for example a bellows pump. The material of the pump 34 is, for example a synthetic resin. For example, when a high-temperature processing liquid (IPA) flows through the pump 34, the synthetic resin forming the bellows pump or the like may dissolve, so that a plurality of particles may be generated. Therefore, the IPA (processing liquid) containing a plurality of particles may flow.

The heater 37 adjusts the temperature of the processing liquid flowing through the processing liquid pipe 32. Specifically, the heater 37 heats the processing liquid flowing through the processing liquid pipe 32.

The filter 35 captures a plurality of particles in the processing liquid. Specifically, a plurality of holes are formed in the filter 35. Each of the holes penetrates in the flow direction of the processing liquid. Specifically, the processing liquid flows from the upstream side to the downstream side of the filter 35 and passes through the holes. The particles contained in the processing liquid from the upstream side of the filter 35 pass through holes, and then are adsorbed by the wall surface that partitions the holes. As a result, the particles are removed from the processing liquid.

The filter 35 includes, for example a polytetrafluoroethylene (PTFE) hydrophilic membrane that functions as a filtration membrane. The PTFE hydrophilic membrane is a film obtained by hydrophilizing the surface of a substrate made of PTFE. The PTFE hydrophilic membrane functioning as the filter 35 has, for example a pore diameter smaller than 7 nm (predetermined diameter). For example, particles of 7 nm (predetermined diameter) or more cannot pass through the pore diameter, and particles less than 7 nm (predetermined diameter) are adsorbed on the wall surface according to the capture capacity of the filter 35, and a plurality of particles are removed from the processing liquid. The capture capacity of the filter 35 varies according to, for example, the type of the processing liquid passing through the filter 35 (for example, the solubility of the synthetic resin in IPA), the flow rate of the processing liquid passing through the filter 35 (the flow rate acting on the particles), or the temperature of the processing liquid passing through the filter 35.

The downstream end of the processing liquid pipe 32 is connected to the external circulation pipes 41. As a result, particles are removed from each of the external circulation pipes 41, and allows the heated processing liquid to flow. In other words, the processing towers 10 are supplied with the processing liquid which particles are removed from and which is heated.

The fluid cabinet 30 further includes the first return pipe 51 and a first adjustment valve 52. The first return pipe 51 returns, to the processing liquid tank 31, the processing liquid supplied from the processing liquid tank 31. Specifically, the upstream end of the first return pipe 51 is connected to the downstream end of the processing liquid pipe 32. The downstream end of the first return pipe 51 is connected to the processing liquid tank 31. The first return pipe 51 is a tubular member having a flow channel that allows the processing liquid to flow through. Note that in the plane perpendicular to the flow direction of the processing liquid, the flow channel of the first return pipe 51 has a cross-sectional area larger than a total cross-sectional area. The total cross-sectional area is the total area of the cross-sectional area of the flow channel of the first external circulation pipe 41A, the cross-sectional area of the flow channel of the second external circulation pipe 41B, and the cross-sectional area of the flow channel of the third external circulation pipe 41C.

Specifically, the cross-sectional area of the flow channel of the first return pipe 51 is larger than the cross-sectional area of the flow channel of each of the external circulation pipes 41. Unlike the external circulation pipes 41, the processing tower 10 is not connected to the first return pipe 51. Further, unlike the external circulation pipes 41, the first return pipe 51 is placed in the fluid cabinet 30.

The first adjustment valve 52 is placed in the first return pipe 51. The first adjustment valve 52 adjusts the flow rate of the processing liquid flowing through the first return pipe 51. The first adjustment valve 52 adjusts the opening degree to adjust the flow rate of the processing liquid flowing through the first return pipe 51. The first adjustment valve 52 is, for example a relief valve whose opening degree is controlled by air pressure. Since the opening degree can be controlled by the air pressure, the controller or the like can control the first adjustment valve 52 with good responsiveness.

As illustrated in FIG. 1 again, the fluid cabinet 30 further includes a plurality of external circulation flow meters 42. Each of the external circulation flow meters 42 is an example of a "second flow rate section". The external circulation flow meters 42 include, for example, a first external circulation flow meter 42A, a second external circulation flow meter 42B, and a third external circulation flow meter 42C.

The first external circulation flow meter 42A is placed in the first external circulation pipe 41A. Specifically, the first external circulation flow meter 42A is arranged on the upstream side of the first branch supply pipe 16A. The first external circulation flow meter 42A measures the flow rate of the processing liquid flowing through the first external circulation pipe 41A.

The second external circulation flow meter 42B is placed in the second external circulation pipe 41B. Specifically, the second external circulation flow meter 42B is placed on the upstream side of the second branch supply pipe 16B. The second external circulation flow meter 42B measures the flow rate of the processing liquid flowing through the second external circulation pipe 41B.

The third external circulation flow meter 42C is placed in the third external circulation pipe 41C. Specifically, the third external circulation flow meter 42C is placed on the upstream side of the third branch supply pipe 16C. The third external circulation flow meter 42C measures the flow rate of the processing liquid flowing through the third external circulation pipe 41C.

The substrate processing apparatus 100 further includes a plurality of external circulation adjustment valves 43. Each of the external circulation adjustment valves 43 is an example of a "second adjustment valve". The external circulation adjustment valves 43 are placed on the platform 20. In other words, the external circulation adjustment valves 43 are placed outside the fluid cabinet 30. The external circulation adjustment valves 43 include, for example, a first external circulation adjustment valve 43A, a second external circulation adjustment valve 43B, and a third external circulation adjustment valve 43C.

The first external circulation adjustment valve 43A is placed in the first external circulation pipe 41A. Specifically, the first external circulation adjustment valve 43A is placed on the downstream side of the first branch supply pipe 16A. The first external circulation adjustment valve 43A adjusts the flow rate of the processing liquid flowing through the first external circulation pipe 41A. The first external circulation adjustment valve 43A adjusts the opening degree to adjust the flow rate of the processing liquid flowing through the first external circulation pipe 41A. The first external circulation adjustment valve 43A is, for example a relief valve whose opening degree is controlled by air pressure.

The second external circulation adjustment valve 43B is placed in the second external circulation pipe 41B. Specifically, the second external circulation adjustment valve 43B is placed on the downstream side of the second branch supply pipe 16B. The second external circulation adjustment valve 43B adjusts the flow rate of the processing liquid flowing through the second external circulation pipe 41B. The second external circulation adjustment valve 43B adjusts the opening degree to adjust the flow rate of the processing liquid flowing through the second external circulation pipe 41B. The second external circulation adjusting valve 43B is, for example a relief valve whose opening degree is controlled by air pressure.

The third external circulation adjustment valve 43C is placed in the third external circulation pipe 41C. Specifically, the third external circulation adjustment valve 43C is placed on the downstream side of the third branch supply pipe 16C. The third external circulation adjustment valve 43C adjusts the flow rate of the processing liquid flowing through the third external circulation pipe 41C. The third external circulation adjustment valve 43C adjusts the opening degree to adjust the flow rate of the processing liquid flowing through the third external circulation pipe 41C. The third external circulation adjustment valve 43C is, for example a relief valve whose opening degree is controlled by air pressure.

Figure 3:
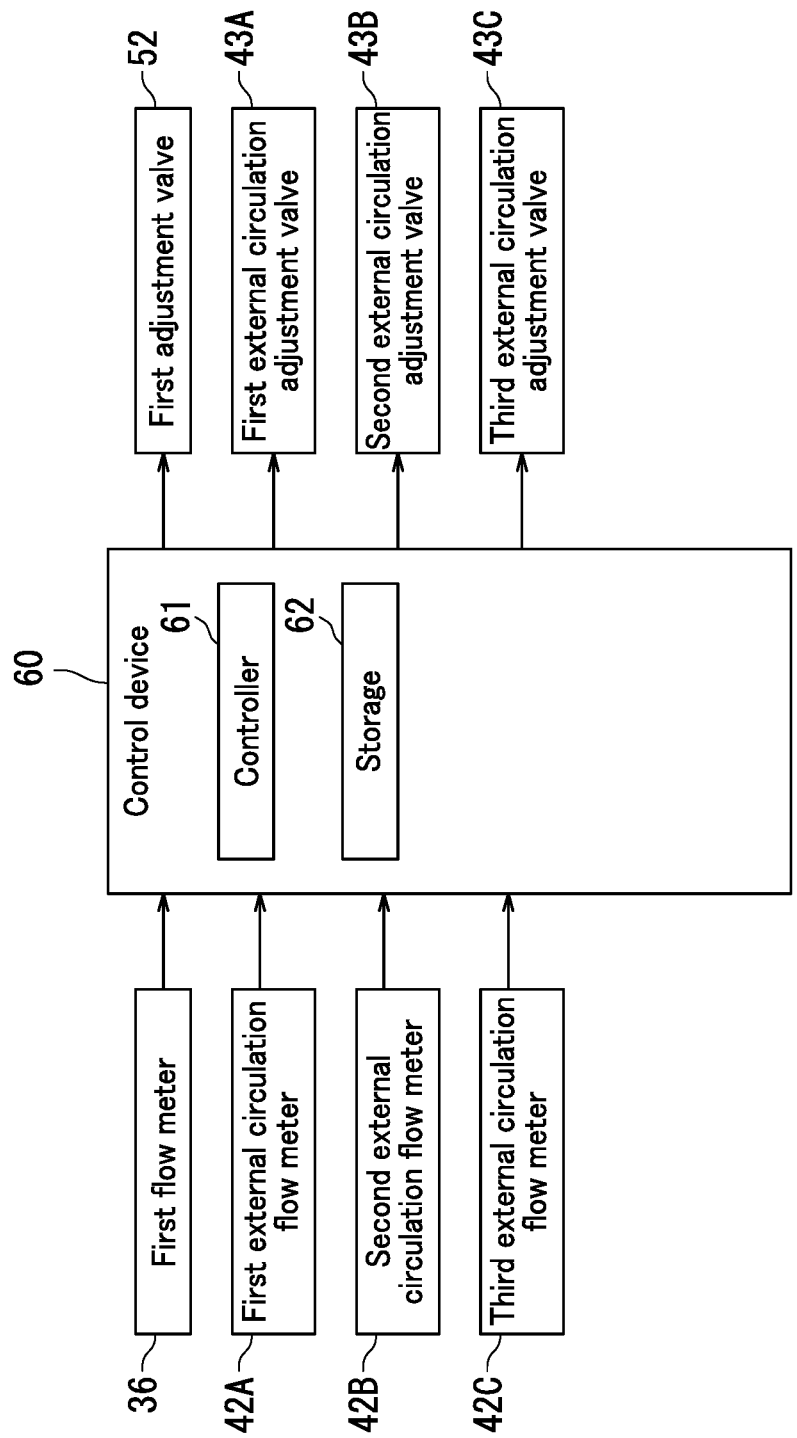
FIG. 3 is a block diagram illustrating a substrate processing apparatus according to the first embodiment.

A control device 60 will subsequently be described with reference to FIG. 3. FIG. 3 is a block diagram illustrating the substrate processing apparatus 100. As illustrated in FIG. 3, the control device 60 controls the operation of each part of the substrate processing device 100. Specifically, the control device 60 includes a controller 61 and storage 62.

The controller 61 includes a processor. For example, the controller 61 includes a central processing unit (CPU) or a micro processing Unit (MPU). Alternatively, the controller 61 may include a general-purpose computer.

The storage 62 stores data and a computer program(s). The data includes recipe data. The recipe data includes information indicating a plurality of recipes. Each of the recipes defines the processing content and processing procedure of the substrate W.

The storage 62 includes a main storage device. The main storage device is, for example a semiconductor memory. The storage 62 may further include an auxiliary storage device. The auxiliary storage device includes, for example, a semiconductor memory and/or a hard disk drive. The storage 62 may include removable media.

The controller 61 controls the operation of each unit of the substrate processing apparatus 100 based on the computer program and data stored in the storage 62. For example, the control device 60 controls the first adjustment valve 52, the first external circulation adjustment valve 43A, the second external circulation adjustment valve 43B, and the third external circulation adjustment valve 43C. The control device 60 also acquires measurement results from the first flow meter 36, the first external circulation flow meter 42A, the second external circulation flow meter 42B, and the third external circulation flow meter 42C.

Here, a "first state" in which the substrate processing apparatus 100 processes the substrate W will be described with reference to FIGS. 1 and 3. The "first state" is a state in which the substrate W is processed in all of the first processing tower 10A, the second processing tower 10B, and the third processing tower 10C.

Specifically, the controller 61 controls the first external circulation adjustment valve 43A based on the flow rate of the processing liquid measured by the first external circulation flow meter 42A so that the processing liquid at a flow rate RA flows through the first external circulation pipe 41A. The controller 61 also controls the second external circulation adjustment valve 43B based on the flow rate of the processing liquid measured by the second external circulation flow meter 42B so that the processing liquid at a flow rate RB flows through the second external circulation pipe 41B. The controller 61 further controls the third external circulation adjustment valve 43C based on the flow rate of the processing liquid measured by the third external circulation flow meter 42C so that the processing liquid at a flow rate RC flows through the third external circulation pipe 41C.

In addition, the controller 61 controls the first adjustment valve 52 based on the flow rate of the processing liquid measured by the first flow meter 36 so that the processing liquid at a predetermined flow rate RT flows through the processing liquid pipe 32. The predetermined flow rate RT is an arbitrary flow rate, and is preset according to, for example the capture capacity by the filter 35. As a result, the processing liquid at the predetermined flow rate RT passes through the heater 37 and the filter 35 in this order. The processing liquid at the flow rate RD then flows through the first return pipe 51. The processing liquid at the flow rate RD is a processing liquid at a flow rate obtained by removing the processing liquid at the flow rate RA, the processing liquid at the flow rate RB, and the processing liquid at the flow rate RC from the processing liquid at the predetermined flow rate RT.

Figure 4:
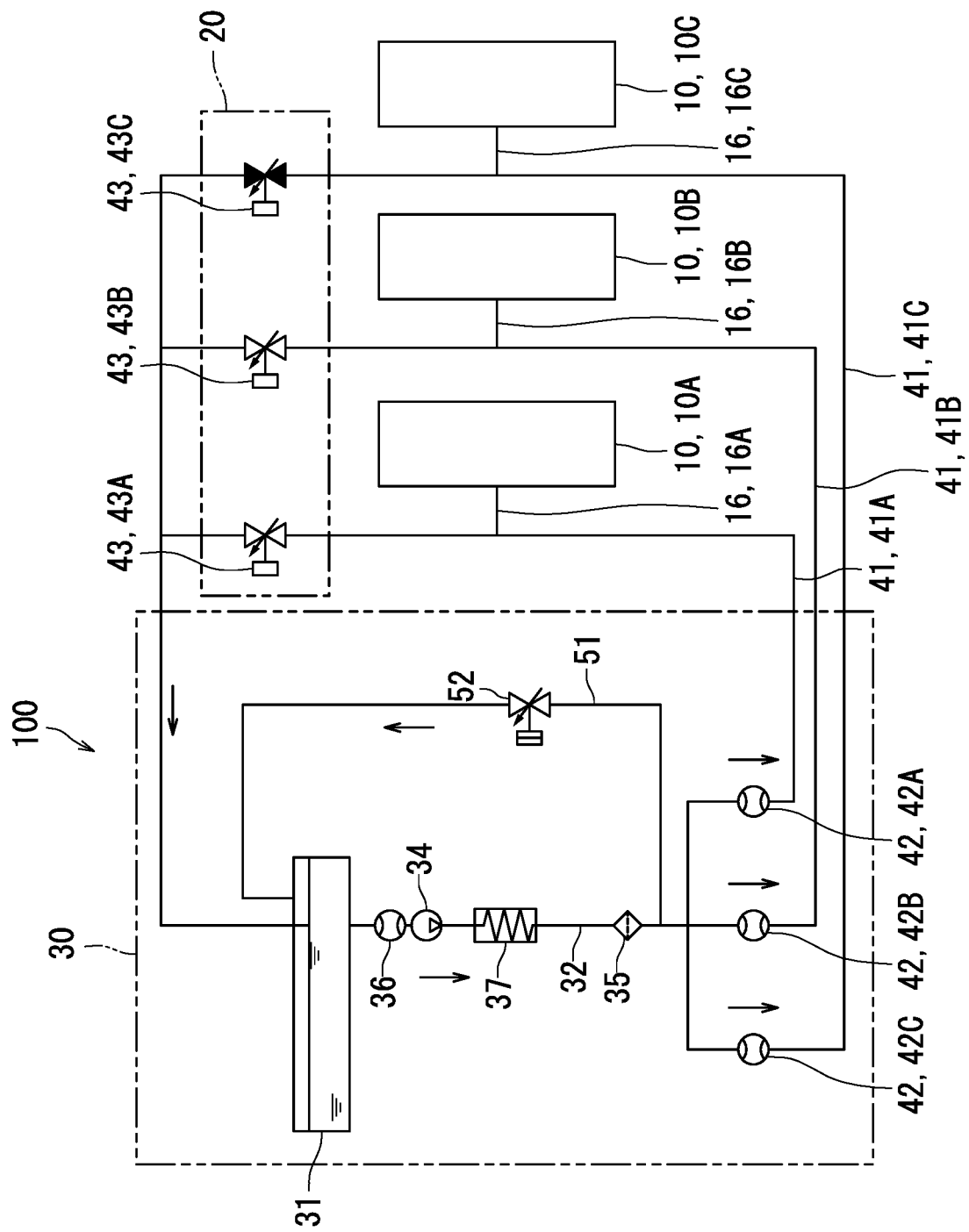
FIG. 4 is a schematic view of a substrate processing apparatus according to the first embodiment.

A "second state" in which the substrate processing apparatus 100 processes the substrate W will subsequently be described with reference to FIG. 4. FIG. 4 is a schematic view of the substrate processing apparatus 100 according to the first embodiment. Note that FIG. 4 is a diagram illustrating a state in which the substrate processing apparatus 100 is in the "second state". Also, the valves illustrated in white are opened and the valve illustrated in black is closed. The "second state" is a state in which maintenance is performed in any of the processing towers 10 including the first processing tower 10A, the second processing tower 10B, and the third processing tower 10C. In the "second state", for example, the first processing tower 10A and the second processing tower 10B each process the substrate W, and maintenance is performed for the third processing tower 10C. Note that maintenance may be performed for two or more processing towers 10 at the same time.

Specifically, the maintenance worker or the like closes all the on-off valves 15 included in the third processing tower 10C. The controller 61 then controls the first external circulation adjustment valve 43A based on the flow rate of the processing liquid measured by the first external circulation flow meter 42A so that the processing liquid at the flow rate RA flows through the first external circulation pipe 41A. The controller 61 also controls the second external circulation adjustment valve 43B based on the flow rate of the processing liquid measured by the second external circulation flow meter 42B so that the processing liquid at the flow rate RB flows through the second external circulation pipe 41B. The controller 61 further controls the third external circulation adjustment valve 43C based on the flow rate of the processing liquid measured by the third external circulation flow meter 42C so that no processing liquid flows through the third external circulation pipe 41C.

In addition, the controller 61 controls the first adjustment valve 52 based on the flow rate of the processing liquid measured by the first flow meter 36 so that the processing liquid at the predetermined flow rate RT flows through the processing liquid pipe 32. As a result, the processing liquid at the predetermined flow rate RT passes through the heater 37 and the filter 35 in this order. The processing liquid at a flow rate (RD+RC) then flows through the first return pipe 51. The processing liquid at the flow rate (RD+RC) is a processing liquid having a flow rate obtained by removing the processing liquid at the flow rate RA and the processing liquid at the flow rate RB from the processing liquid at the predetermined flow rate RT.

As described above, the first embodiment of the present disclosure has been described as illustrated in FIGS. 1 to 4. In the first embodiment, the controller 61 controls the first adjustment valve 52 based on the flow rate of the processing liquid measured by the first flow meter 36. Therefore, the flow rate of the processing liquid flowing through the processing liquid pipe 32 being adjusted enables the filter 35 to efficiently capture a plurality of particles in the processing liquid. Accordingly, the processing liquid having a low particle content can be supplied to the processing towers 10.

The controller 61 also controls the opening degree of the first adjustment valve 52 so that the flow rate of the processing liquid flowing through the processing liquid pipe 32 becomes the predetermined flow rate RT. Therefore, the processing liquid at the predetermined flow rate RT flowing through the processing liquid pipe 32 enables the filter 35 to exhibit a predetermined capture capacity. Accordingly, a processing liquid having a smaller particle content can be supplied to the processing towers 10.

The controller 61 then controls the opening degree of the first adjustment valve 52 and the opening degree of the external circulation adjustment valve 43. Therefore, the processing liquid at the predetermined flow rate RT flowing through the processing liquid pipe 32 even in both the "first state" and the "second state" enables the filter 35 to exhibit a predetermined capture capacity. Accordingly, while maintenance is performed for the third processing tower 10C, a processing liquid having a smaller particle content can be supplied to the first processing tower 10A and the second processing tower 10B.

The heater 37 further adjusts the temperature of the processing liquid flowing through the processing liquid pipe 32. As a result, because the processing liquid at the predetermined flow rate RT flows through the processing liquid pipe 32 in both the "first state" and the "second state", the heater 37 can adjust the temperature of the processing liquid to a constant temperature. Accordingly, the processing towers 10 can be supplied with the processing liquid adjusted to the constant temperature.

Figure 5:
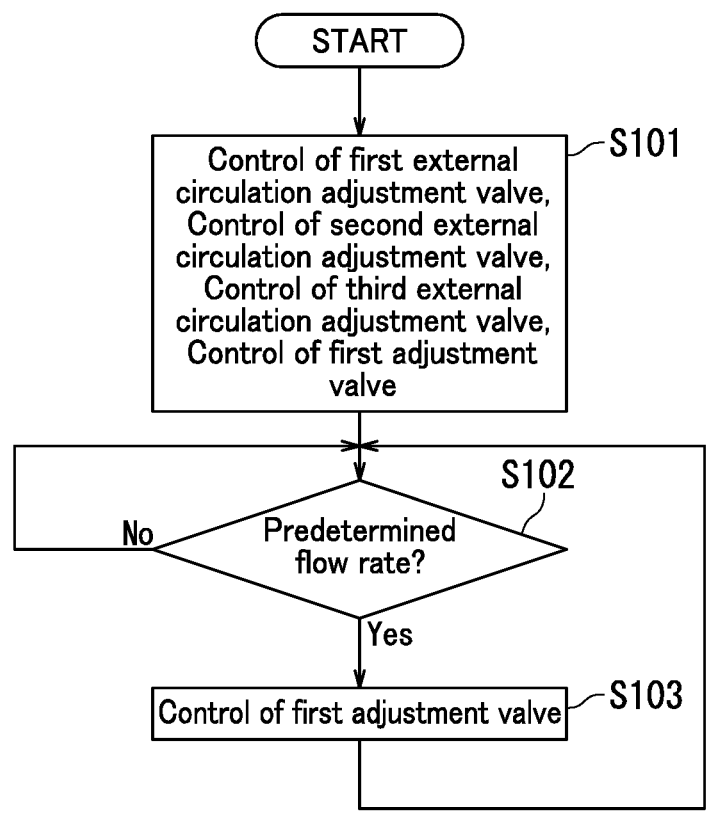
FIG. 5 is a flowchart illustrating processing by a controller included in the substrate processing apparatus of the first embodiment.

A substrate processing method according to the first embodiment will subsequently be described with reference to FIG. 5. The substrate processing method according to the first embodiment is executed by the substrate processing apparatus 100 described with reference to FIGS. 1 to 4. FIG. 5 is a flowchart illustrating a process by the controller 61 included in the substrate processing apparatus 100 according to the first embodiment.

As illustrated in FIG. 5, the controller 61 first controls the first external circulation adjustment valve 43A based on the flow rate of the processing liquid measured by the first external circulation flow meter 42A so that the processing liquid at the flow rate RA flows through the first external circulation pipe 41A. The controller 61 also controls the second external circulation adjustment valve 43B based on the flow rate of the processing liquid measured by the second external circulation flow meter 42B so that the processing liquid at the flow rate RB flows through the second external circulation pipe 41B. The controller 61 further controls the third external circulation adjustment valve 43C based on the flow rate of the processing liquid measured by the third external circulation flow meter 42C so that the processing liquid at the flow rate RC flows through the third external circulation pipe 41C. The controller 61 controls the first adjustment valve 52 based on the flow rate of the processing liquid measured by the first flow meter 36 so that the processing liquid at the predetermined flow rate RT flows through the processing liquid pipe 32 (Step S101).

The controller 61 determines whether or not the flow rate of the processing liquid measured by the first flow meter 36 is the predetermined flow rate RT (Step S102). When the controller 61 determines that the flow rate of the processing liquid measured by the first flow meter 36 is the predetermined flow rate RT (Yes in step S102), the process returns to step S102.

On the other hand, when the controller 61 determines that the flow rate of the processing liquid measured by the first flow meter 36 is not the predetermined flow rate RT (No in step S102), the controller 61 controls the first adjustment valve 52 so that the flow rate of the processing liquid measured by the first flow meter 36 becomes the predetermined flow rate RT (Step S103). The process is completed and then returns to step S102.

Second Embodiment

Figure 6:
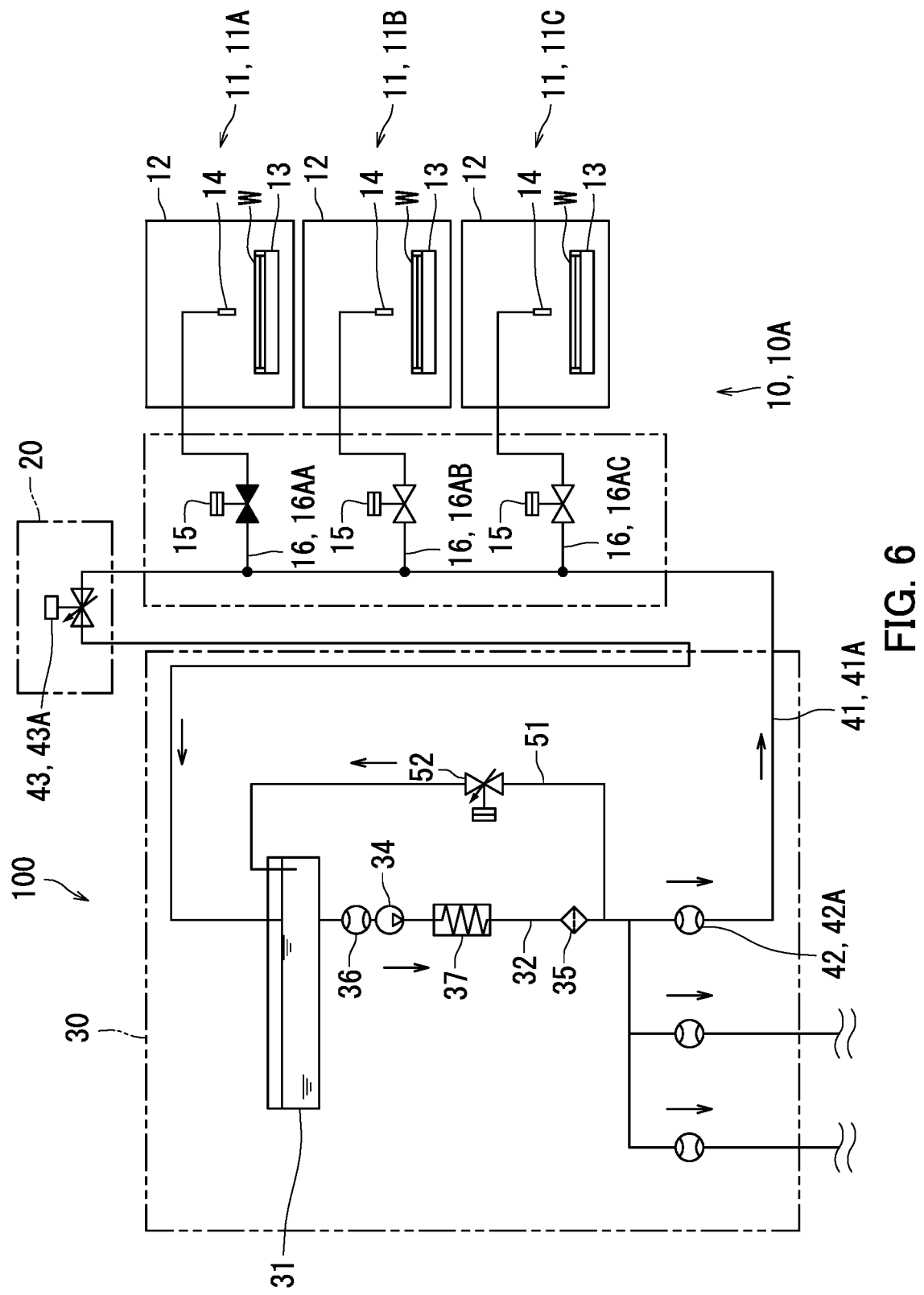
FIG. 6 is a schematic view of a processing tower included in a substrate processing apparatus according to a second embodiment of the present disclosure.

A second embodiment of the present disclosure will be described with reference to FIG. 6. FIG. 6 is a schematic view of a substrate processing apparatus 100 according to the second embodiment. Note that FIG. 6 is a diagram illustrating a state in which the substrate processing apparatus 100 is in a "third state". The "third state" is a state in which all of a first processing tower 10A, a second processing tower 10B, and a third processing tower 10C each process their own substrates W with maintenance performed for at least one processing unit 11. However, components different from those of the first embodiment will be described, and description of the same components as those of the first embodiment will be omitted.

In the "third state", for example, all of the first processing tower 10A, the second processing tower 10B, and the third processing tower 10C each process their own substrates W with the maintenance performed for one processing unit 11A in the first processing tower 10A. Specifically, a maintenance worker or the like closes an on-off valve 15 placed in a first supply pipe 16AA. A controller 61 then controls a first external circulation adjustment valve 43A based on the flow rate of a processing liquid measured by a first external circulation flow meter 42A so that the processing liquid at a flow rate (RA-Ra) flows through a first external circulation pipe 41A. The controller 61 also controls a second external circulation adjustment valve 43B based on the flow rate of a processing liquid measured by a second external circulation flow meter 42B so that the processing liquid at a flow rate RB flows through a second external circulation pipe 41B. The controller 61 further controls a third external circulation adjustment valve 43C based on the flow rate of a processing liquid measured by a third external circulation flow meter 42C so that the processing liquid at a flow rate RC flows through a third external circulation pipe 41C.

The controller 61 controls a first adjustment valve 52 based on the flow rate of a processing liquid measured by a first flow meter 36 so that the processing liquid at a predetermined flow rate RT flows through a processing liquid pipe 32. As a result, the processing liquid at the predetermined flow rate RT passes through a heater 37 and a filter 35 in this order. The processing liquid at a flow rate (RD+Ra) then flows through a first return pipe 51. The processing liquid at the flow rate (RD+Ra) is a processing liquid at a flow rate obtained by removing the processing liquid at the flow rate (RA−Ra), the processing liquid at the flow rate RB, and the processing liquid at the flow rate RC from the processing liquid at the predetermined flow rate RT.

As described above, the second embodiment of the present disclosure has been described as illustrated in FIG. 6. In the second embodiment, the controller 61 controls the first adjustment valve 52 based on the flow rate of the processing liquid measured by the first flow meter 36. As a result, because the processing liquid at the predetermined flow rate RT flows through the processing liquid pipe 32 in both the "first state" and the "third state", the filter 35 exhibits a predetermined capturing ability. Accordingly, while the maintenance is performed for one processing unit 11, other processing units 11 can be supplied with the processing liquid containing a smaller particle content.

Third Embodiment

Figure 7:
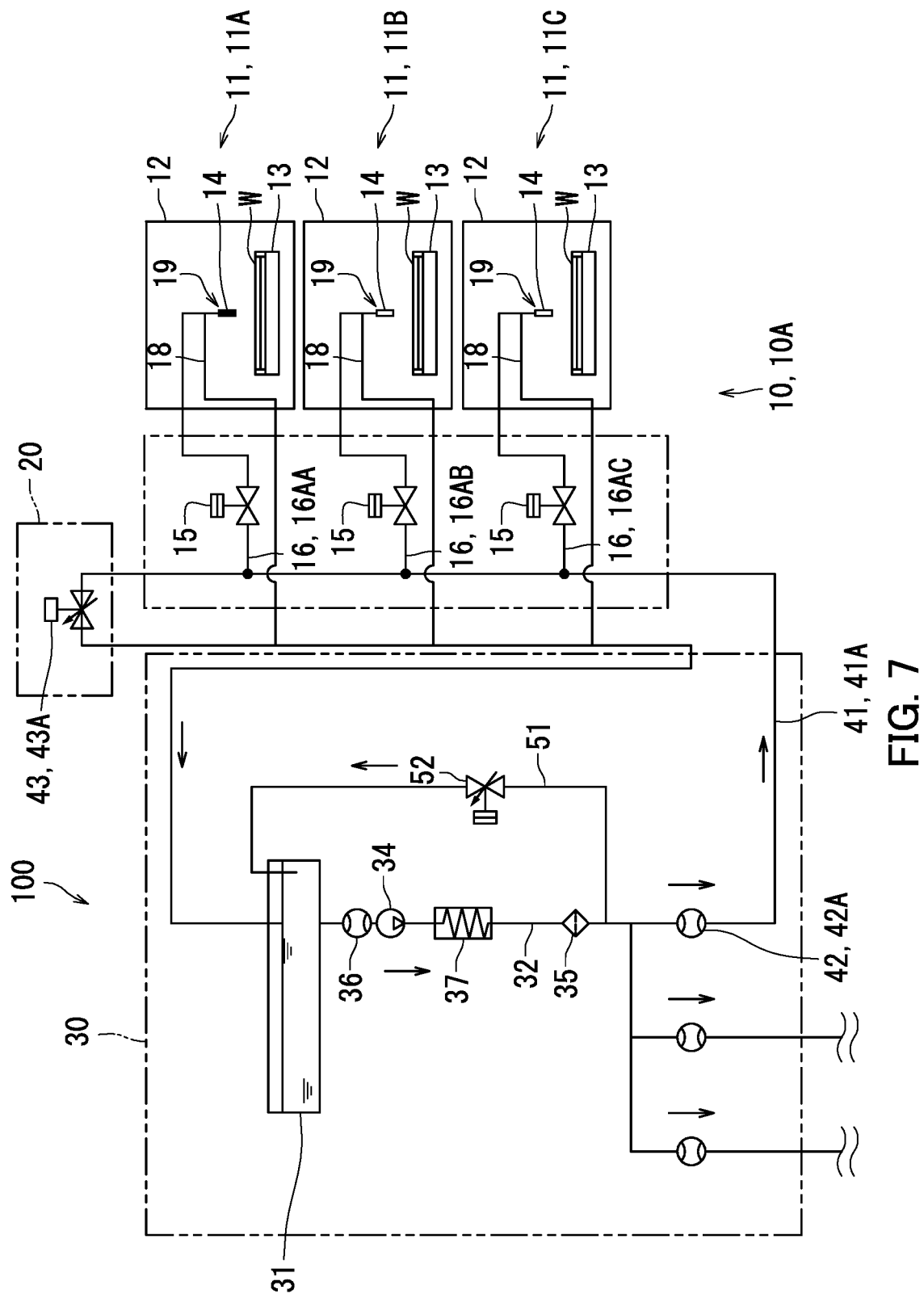
FIG. 7 is a schematic view of a processing tower included in a substrate processing apparatus according to a third embodiment of the present disclosure.

A third embodiment of the present disclosure will be described with reference to FIG. 7. FIG. 7 is a schematic view of a substrate processing apparatus 100 according to the third embodiment. Note that FIG. 7 is a diagram illustrating a state in which the substrate processing apparatus 100 is in the "third state". However, components different from those of the second embodiment will be described, and description of the same components as those of the second embodiment will be omitted.

As illustrated in FIG. 7, each of a plurality of processing units 11 includes an on-off valve 19 and a third return pipe 18. The on-off valve 19 is an example of a "switch section". The on-off valve 19 switches between start and stop of the supply of a processing liquid from a branch supply pipe 16 to a nozzle 14. The on-off valve 19 is, for example a motor needle valve that opens and closes by electric power under control.

The third return pipe 18 branches from a branch supply pipe 16A. The third return pipe 18 is connected to an external circulation pipe 41 on the downstream side of an external circulation adjustment valve 43. The third return pipe 18 is a tubular member having a flow channel that allows the processing liquid to flow through. When the on-off valve 19 is closed, the processing liquid flows through the third return pipe 18. As a result, the temperature of the nozzle 14 can be maintained by circulating the heated processing liquid through the third return pipe 18.

Specifically, a maintenance worker or the like closes the on-off valve 19 of the nozzle 14 connected to a first supply pipe 16AA. A controller 61 then controls a first external circulation adjustment valve 43A based on the flow rate of a processing liquid measured by a first external circulation flow meter 42A so that the processing liquid at a flow rate (RA−Raa) flows through a first external circulation pipe 41A. The controller 61 also controls a second external circulation adjustment valve 43B based on the flow rate of a processing liquid measured by a second external circulation flow meter 42B so that the processing liquid at a flow rate RB flows through a second external circulation pipe 41B. The controller 61 further controls a third external circulation adjustment valve 43C based on the flow rate of a processing liquid measured by a third external circulation flow meter 42C so that the processing liquid at a flow rate RC flows through a third external circulation pipe 41C.

In addition, the controller 61 controls a first adjustment valve 52 based on the flow rate of a processing liquid measured by a first flow meter 36 so that the processing liquid at a predetermined flow rate RT flows through a processing liquid pipe 32. As a result, the processing liquid at the predetermined flow rate RT passes through a heater 37 and a filter 35 in this order. The processing liquid at a flow rate (RD+Raa) flows through a first return pipe 51. The processing liquid at the flow rate (RD+Raa) is a processing liquid at a flow rate obtained by removing the processing liquid at the flow rate (RA−Raa), the processing liquid at the flow rate RB, and the processing liquid at the flow rate RC from the processing liquid at the predetermined flow rate RT.

As described above, the third embodiment of the present disclosure has been described as illustrated in FIG. 7. In the third embodiment, the controller 61 controls the first adjustment valve 52 based on the flow rate of the processing liquid measured by the first flow meter 36. Because the processing liquid at the predetermined flow rate RT flows through the processing liquid pipe 32 in both the "first state" and the "third state", the filter 35 exhibits a predetermined capturing ability. Accordingly, while maintenance is performed for one processing unit 11, other processing units 11 can be supplied with the processing liquid containing a smaller particle content.

Fourth Embodiment

Figure 8:
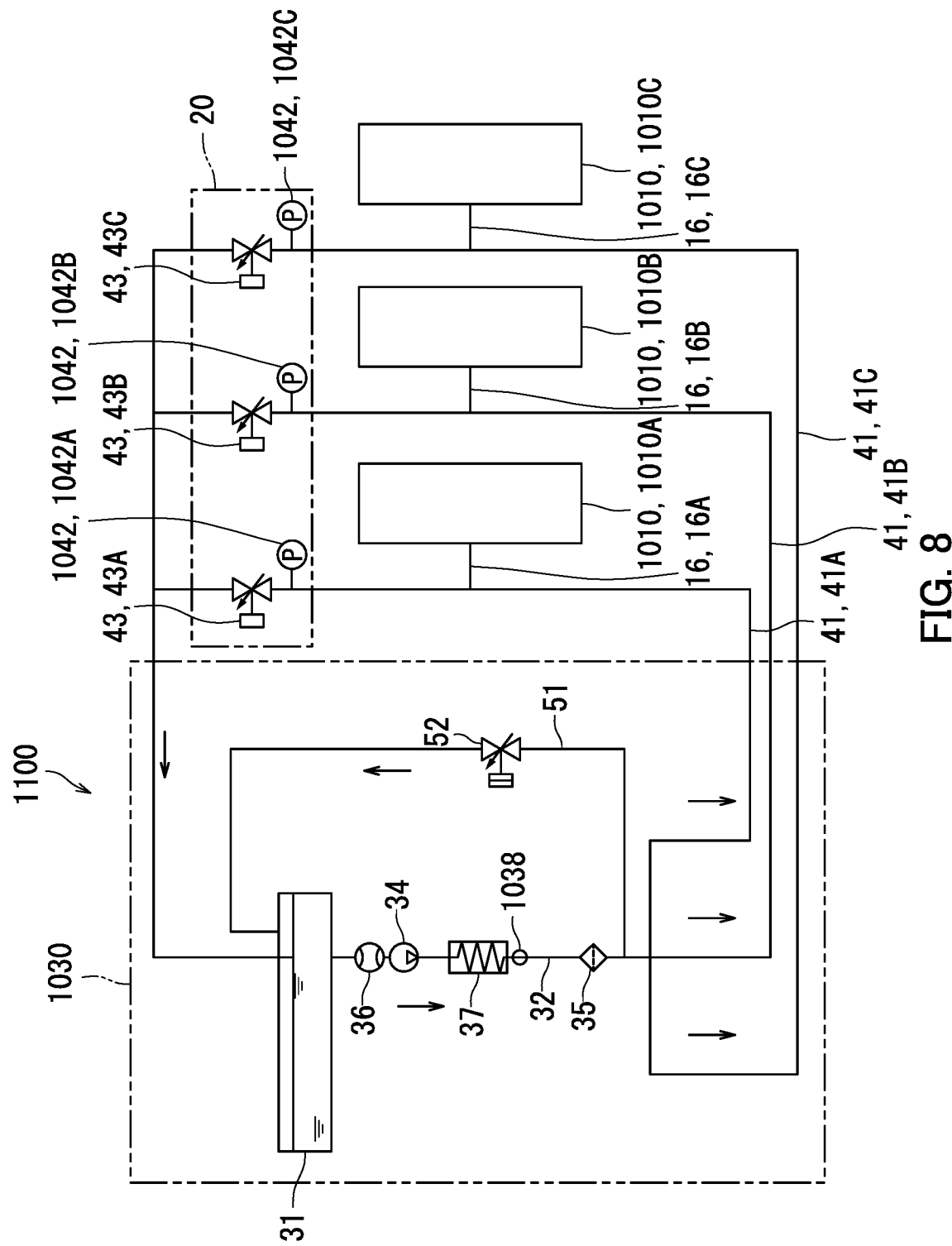
FIG. 8 is a schematic diagram of a substrate processing apparatus according to a fourth embodiment of the present disclosure.
Figure 9:
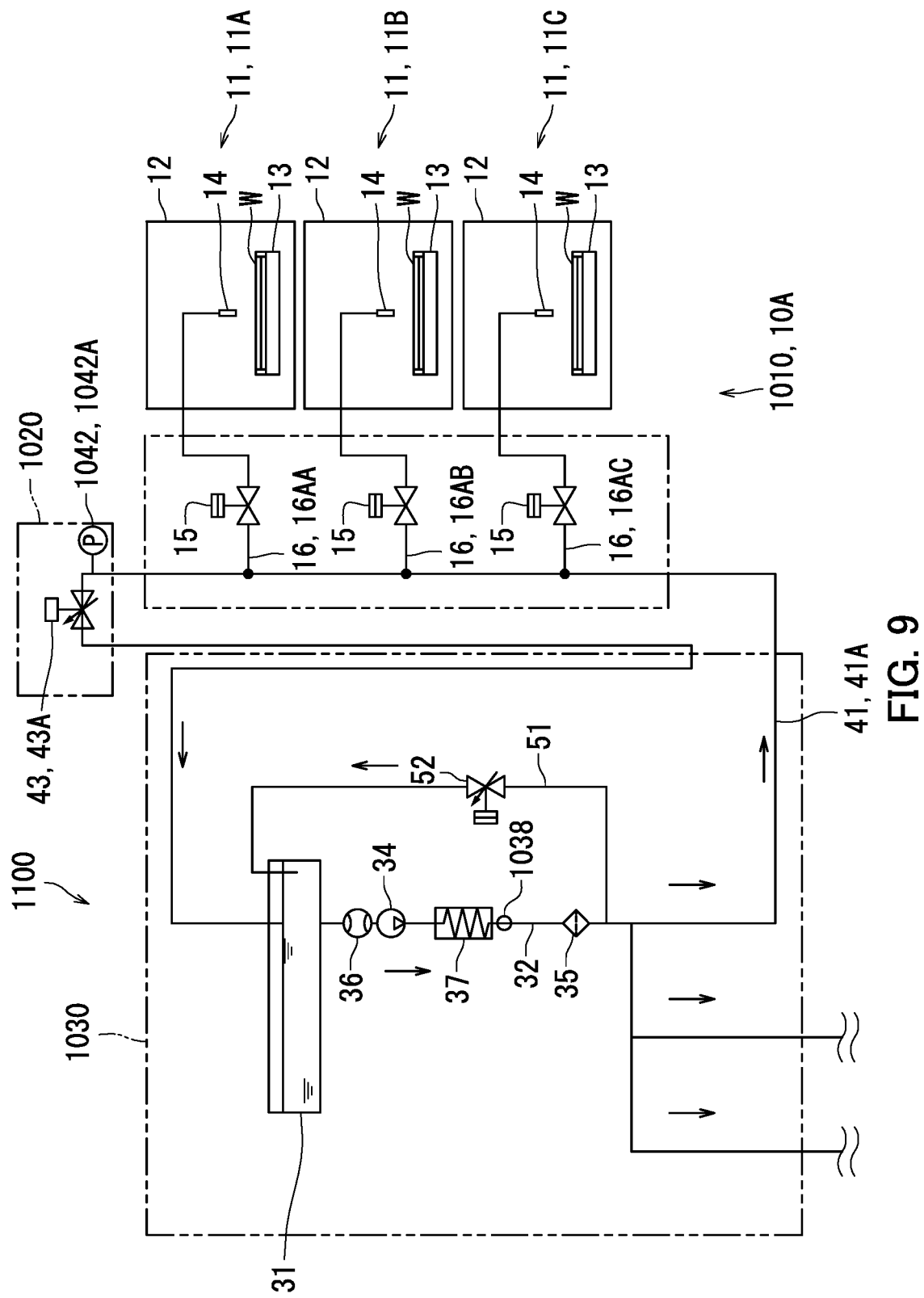
FIG. 9 is a schematic view of a processing tower included in the substrate processing apparatus according to the fourth embodiment.

A fourth embodiment of the present disclosure will be described with reference to FIGS. 8 and 9. FIG. 8 is a schematic view of a substrate processing apparatus 1100 according to the fourth embodiment. FIG. 9 is a schematic view of a processing tower 1010 included in the substrate processing apparatus 1100 of the fourth embodiment. However, matters different from those of the first embodiment will be described, and description of the same matters as those of the first embodiment will be omitted.

In the fourth embodiment, the case where the processing liquid is sulfuric acid will be described. As illustrated in FIGS. 8 and 9, a processing liquid tank 31 stores a processing liquid. The processing liquid contains, for example sulfuric acid. The viscosity of sulfuric acid is high at low temperatures and low at high temperatures. It can be difficult to accurately measure a liquid whose viscosity is high.

The fourth embodiment is different from the first embodiment in that a plurality of external circulation pressure gauges 1042 are provided instead of the plurality of external circulation flow meters 42. Specifically, a platform 20 further includes the external circulation pressure gauges 1042. Each of the external circulation pressure gauges 1042 is an example of the "second flow rate section". The external circulation pressure gauges 1042 include, for example, a first external circulation pressure gauge 1042A, a second external circulation pressure gauge 1042B, and a third external circulation pressure gauge 1042C.

The first external circulation pressure gauge 1042A is placed in a first external circulation pipe 41A. Specifically, the first external circulation pressure gauge 1042A is arranged on the downstream side of a first branch supply pipe 16A. The first external circulation pressure gauge 1042A is arranged on the upstream side of a first external circulation adjustment valve 43A. The first external circulation pressure gauge 1042A measures the pressure of the processing liquid flowing through the first external circulation pipe 41A.

The second external circulation pressure gauge 1042B is placed in a second external circulation pipe 41B. Specifically, the second external circulation pressure gauge 1042B is arranged on the downstream side of a second branch supply pipe 16B. The second external circulation pressure gauge 1042B is arranged on the upstream side of the second external circulation adjusting valve 43B. The second external circulation pressure gauge 1042B measures the pressure of the processing liquid flowing through a second external circulation pipe 41B.

The third external circulation pressure gauge 1042C is placed in a third external circulation pipe 41C. Specifically, the third external circulation pressure gauge 1042C is arranged on the downstream side of a third branch supply pipe 16C. The third external circulation pressure gauge 1042C is arranged on the upstream side of a third external circulation adjusting valve 43C. The third external circulation pressure gauge 1042C measures the pressure of the processing liquid flowing through the third external circulation pipe 41C.

A fluid cabinet 1030 further includes a pump 34, a filter 35, a first flow meter 36, a heater 37, and a thermometer 1038. The first flow meter 36, the pump 34, the heater 37, the thermometer 1038, and the filter 35 are arranged, in this order, in a processing liquid pipe 32 from the upstream to the downstream of the processing liquid pipe 32.

The thermometer 1038 measures the temperature of the processing liquid flowing through the processing liquid pipe 32.

Figure 10:
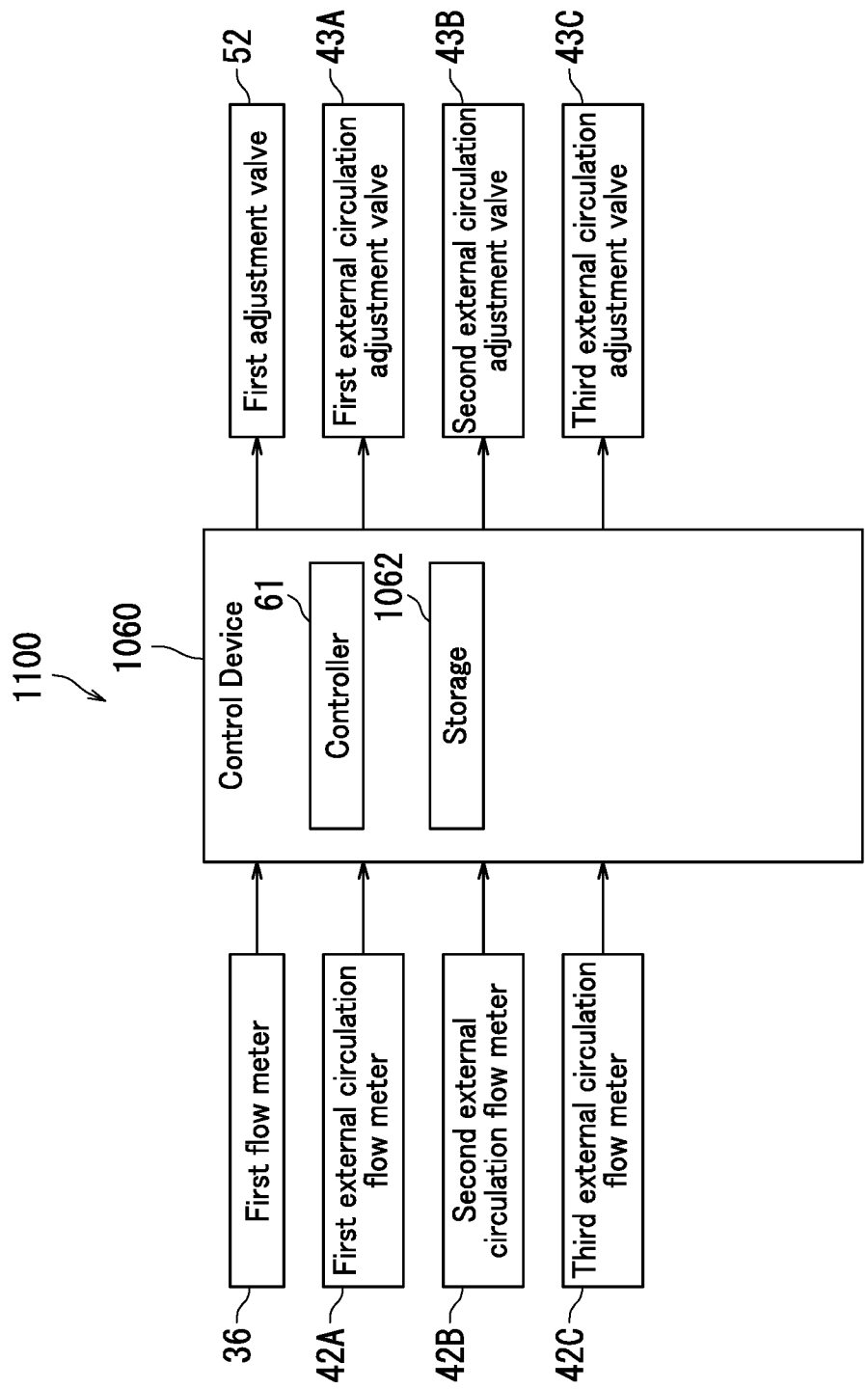
FIG. 10 is a block diagram illustrating the substrate processing apparatus according to the fourth embodiment.

Subsequently, a control device 1060 will be described with reference to FIG. 10. FIG. 10 is a block diagram illustrating the substrate processing apparatus 1100. As illustrated in FIG. 10, the control device 1060 includes a controller 61 and storage 1062.

The storage 1062 stores data and a computer program(s). The data includes first data representing the relationship between the temperature of the processing liquid flowing through the processing liquid pipe 32, the pressure of the processing liquid flowing through the pipe, and the flow rate of the processing liquid flowing through the pipe. The data may however be second data representing the relationship between the temperature of the processing liquid flowing through the processing liquid pipe 32, the pressure of the processing liquid flowing through the pipe, and the rotation speed of the pump 34 as a result of understanding the relationship between the rotation speed of the pump 34 and the flow rate of the processing liquid flowing through the pipe.

The controller 61 controls the operation of each section of the substrate processing apparatus 1100 based on the computer program and the data stored in the storage 1062. For example, the control device 1060 acquires a measurement result from each of the first flow meter 36, the first external circulation pressure gauge 1042A, the second external circulation pressure gauge 1042B, the third external circulation pressure gauge 1042C, and the thermometer 1038. Based on the first data, the control device 1060 controls a first adjustment valve 52, the first external circulation adjustment valve 43A, the second external circulation adjustment valve 43B, the third external circulation adjustment valve 43C, and the pump 34. Specifically, the control device 1060 feedback-controls the first adjustment valve 52, the first external circulation adjustment valve 43A, the second external circulation adjustment valve 43B, the third external circulation adjustment valve 43C, and the pump 34.

As described above, the fourth embodiment of the present disclosure has been described with reference to FIGS. 8 to 10. According to the fourth embodiment, the control unit 61 controls the first adjustment valve 52 based on the flow rate of the processing liquid measured by the first flow meter 36. As a result, the flow rate of the processing liquid flowing through the processing liquid pipe 32 is adjusted, so that the filter 35 can efficiently capture particles in the processing liquid. Therefore, the processing liquid having a low particle content can be supplied to the processing tower 1010.

Further, since the fourth embodiment includes the external circulation pressure gauges 1042, the flow rate of the processing liquid flowing through the processing liquid pipe 32 can be accurately adjusted even when the processing liquid is sulfuric acid whose viscosity is high.
Therefore, the processing liquid having a low particle content can be supplied to the processing tower 1010.

The embodiments of the present disclosure have been described above with reference to the drawings (FIGS. 1 to 10). However, the present disclosure is not limited to the above-described embodiments, and may be implemented in various aspects without departing from the gist thereof. In addition, various aspects may be created by appropriately combining the plurality of components disclosed in the above-described embodiments. For example, some components of all the components illustrated in one embodiment may be added to components of another embodiment. Further, some components of all the components illustrated in a certain embodiment may be removed from the embodiment.

The drawings schematically illustrate each component as a main body in order to make it easier to understand. The thickness, length, number, intervals and the like of illustrated components may differ from the actual ones for the convenience of the drawing. Further, the configurations of components illustrated in the above embodiments are examples and not particularly limited, and various modifications may be made without substantially deviating from the effects of the present disclosure.

(1) For example, in the "second state", the first processing tower 10A and the second processing tower 10B each process their own substrates W with the maintenance performed for the third processing tower 10C, but the present disclosure is not particularly limited thereto. Preparations for processing the substrates W as the maintenance may be performed for the first processing tower 10A, the second processing tower 10B, and the third processing tower 10B in the "second state".

Specifically, all the on-off valves 15 are closed. The controller 61 controls the first external circulation adjustment valve 43A based on the flow rate of the processing liquid measured by the first external circulation flow meter 42A so that no processing liquid flows through the first external circulation pipe 41A. The controller 61 also controls the second external circulation adjustment valve 43B based on the flow rate of the processing liquid measured by the second external circulation flow meter 42B so that no processing liquid flows through the second external circulation pipe 41B. The controller 61 further controls the third external circulation adjustment valve 43C based on the flow rate of the processing liquid measured by the third external circulation flow meter 42C so that no processing liquid flows through the third external circulation pipe 41C.

In addition, the controller 61 controls the first adjustment valve 52 based on the flow rate of the processing liquid measured by the first flow meter 36 so that the processing liquid at the predetermined flow rate RT flows through the processing liquid pipe 32. As a result, the processing liquid at the predetermined flow rate RT passes through the heater 37 and the filter 35 in this order. The processing liquid at a flow rate (RD+RA+RB+RC) flows through the first return pipe 51.

(2) For example, the downstream end of the first return pipe 51 is connected to the processing liquid tank 31, but the present disclosure is not particularly limited thereto. The downstream end of the first return pipe 51 may be connected to the downstream end of the external circulation pipe 41.

(3) For example, the first flow meter 36, the pump 34, the heater 37, and the filter 35 are arranged, in this order, in the processing liquid pipe 32 from the upstream to the downstream of the processing liquid pipe 32, but the present disclosure is not particularly limited thereto. The first flow meter 36 may be placed at an arbitrary position in the processing liquid pipe 32.

(4) For example, the external circulation adjustment valve 43 is placed in the external circulation pipe 41 on the downstream side of the branch supply pipe 16, but the present disclosure is not particularly limited thereto. The external circulation flow meter 42 may be placed in the external circulation pipe 41 on the upstream side of the branch supply pipe 16.

(5) For example, the maintenance worker operates the on-off valve 15 and the on-off valve 19, but the present disclosure is not particularly limited thereto. The control device 60 may control the on-off valve 15 and the on-off valve 19.

(6) For example, the fluid cabinet 30 includes the first flow meter 36, but is not particularly limited thereto. The fluid cabinet 30 may include a first pressure gauge instead of the first flow meter 36.

What is claimed is:

1. A substrate processing apparatus comprising:
   a processing unit that processes a substrate with a processing liquid;
   a reservoir that stores the processing liquid;
   a processing liquid pipe that is connected to the reservoir and that allows the processing liquid to flow through;
   a pump that is placed in the processing liquid pipe and that supplies the processing liquid from the reservoir to the processing liquid pipe;
   a filter that is placed in the processing liquid pipe and that captures particles in the processing liquid;
   a first flow rate section that is placed in the processing liquid pipe and that measures a flow rate or pressure of the processing liquid flowing through the processing liquid pipe;
   a first return pipe that is connected to a downstream end of the processing liquid pipe and that returns the processing liquid to the reservoir;
   a first adjustment valve that is placed in the first return pipe and that adjusts a flow rate of the processing liquid flowing through the first return pipe;
   a second return pipe that is connected to the downstream end of the processing liquid pipe and that returns the processing liquid to the reservoir;
   a branch supply pipe that branches from the second return pipe and that supplies the processing liquid to the processing unit;
   a second flow meter that measures a flow rate or pressure of the processing liquid flowing through the second return pipe; and
   a controller that controls an opening degree of the first adjustment valve based on the flow rate or the pressure of the processing liquid measured by the first flow rate section.

2. The substrate processing apparatus according to claim 1, wherein the second flow meter is placed in the second return pipe at a position on a downstream side of the branch supply pipe and measures pressure of the processing liquid flowing through the second return pipe.

3. A substrate processing apparatus comprising:
   a processing unit that processes a substrate with a processing liquid;
   a reservoir that stores the processing liquid;
   a processing liquid pipe that is connected to the reservoir and that allows the processing liquid to flow through;
   a pump that is placed in the processing liquid pipe and that supplies the processing liquid from the reservoir to the processing liquid pipe;
   a filter that is placed in the processing liquid pipe and that captures particles in the processing liquid;
   a first flow meter that is placed in the processing liquid pipe and that measures a flow rate of the processing liquid flowing through the processing liquid pipe;
   a first return pipe that is connected to a downstream end of the processing liquid pipe and that returns the processing liquid to the reservoir;
   a first adjustment valve that is placed in the first return pipe and that adjusts a flow rate of the processing liquid flowing through the first return pipe;
   a second return pipe that is connected to the downstream end of the processing liquid pipe and that returns the processing liquid to the reservoir;
   a branch supply pipe that branches from the second return pipe and that supplies the processing liquid to the processing unit;
   a second flow meter that is placed in the second return pipe at a position on an upstream side of the branch supply pipe and that measures a flow rate of the processing liquid flowing through the branch supply pipe; and
   a controller that controls an opening degree of the first adjustment valve based on the flow rate of the processing liquid measured by the first flow meter.

4. The substrate processing apparatus according to claim 3, wherein the controller controls the opening degree of the first adjustment valve so that the flow rate of the processing liquid flowing through the processing liquid pipe becomes a predetermined flow rate.

5. The substrate processing apparatus according to claim 4, further comprising a temperature controller that is placed in the processing liquid pipe, wherein
   the temperature controller adjusts a temperature of the processing liquid flowing through the processing liquid pipe.

6. The substrate processing apparatus according to claim 5, further comprising a second adjustment valve that is placed in the second return pipe and that adjusts a flow rate of the processing liquid flowing through the second return pipe, wherein
   the controller controls the opening degree of the first adjustment valve and an opening degree of the second adjustment valve.

7. The substrate processing apparatus according to claim 6, further comprising a thermometer that is placed in the processing liquid pipe and that measures temperature of the processing liquid flowing through the processing liquid pipe wherein
   the controller controls the opening degree of the second adjustment valve based on the temperature of the processing liquid measured by the thermometer.

8. The substrate processing apparatus according to claim 6, wherein the processing unit comprises:
   a nozzle that is placed at a downstream end of the branch supply pipe;
   a switch section that switches between start and stop of supply of the processing liquid from the branch supply pipe to the nozzle; and
   a third return pipe that branches from the branch supply pipe and that is connected to the second return pipe on a downstream side of the second adjustment valve.

9. A substrate processing method of a substrate processing apparatus, the substrate processing apparatus comprising:
   a processing unit that processes a substrate with a processing liquid;
   a reservoir that stores the processing liquid;
   a processing liquid pipe that is connected to the reservoir and that allows the processing liquid to flow through;

a pump that is placed in the processing liquid pipe;
a filter that is placed in the processing liquid pipe;
a first flow rate section that is placed in the processing liquid pipe;
a first return pipe that is connected to a downstream end of the processing liquid pipe and that returns the processing liquid to the reservoir;
a first adjustment valve that is placed in the first return pipe and that adjusts a flow rate of the processing liquid flowing through the first return pipe;
a second return pipe that is connected to the downstream end of the processing liquid pipe and that returns the processing liquid to the reservoir;
a branch supply pipe that branches from the second return pipe and that supplies the processing liquid to the processing unit; and
a second flow meter that is placed in the second return pipe, wherein
the substrate processing method comprises:
supplying the processing liquid from the reservoir to the processing liquid pipe;
capturing particles in the processing liquid;
measuring a flow rate or pressure of the processing liquid flowing through the processing liquid pipe;
measuring a flow rate or pressure of the processing liquid flowing through the second return pipe; and
controlling an opening degree of the first adjustment valve based on the flow rate or the pressure of the processing liquid measured by the first flow rate section.

* * * * *